(12) United States Patent
Yamanobe

(10) Patent No.: US 11,667,008 B2
(45) Date of Patent: Jun. 6, 2023

(54) SUBSTRATE PROCESSING APPARATUS AND SUBSTRATE PROCESSING METHOD

(71) Applicant: EBARA CORPORATION, Tokyo (JP)

(72) Inventor: Hokuto Yamanobe, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/337,731

(22) Filed: Jun. 3, 2021

(65) Prior Publication Data

US 2021/0402562 A1    Dec. 30, 2021

(30) Foreign Application Priority Data

Jun. 26, 2020    (JP) .............................. JP2020-110491

(51) Int. Cl.
  *B24B 53/00*     (2006.01)
  *B24B 53/017*    (2012.01)
  *B24B 9/06*      (2006.01)

(52) U.S. Cl.
  CPC ............ *B24B 53/017* (2013.01); *B24B 9/065* (2013.01); *B24B 53/003* (2013.01)

(58) Field of Classification Search
  CPC ....... B24B 21/002; B24B 21/04; B24B 21/12; B24B 21/20; B24B 21/22; B24B 9/065; B24B 37/02
  USPC ................... 451/6, 303, 307, 310, 446, 456
  See application file for complete search history.

(56) References Cited

U.S. PATENT DOCUMENTS

| | | | |
|---|---|---|---|
| 9,287,158 B2 * | 3/2016 | Takahashi | ......... H01L 21/67253 |
| 2008/0293344 A1 * | 11/2008 | Ettinger | ................. B24B 9/065 |
| | | | 451/527 |
| 2009/0142992 A1 * | 6/2009 | Takahashi | ............. B24B 21/002 |
| | | | 451/36 |
| 2010/0136886 A1 * | 6/2010 | Hongo | .................... B24B 9/065 |
| | | | 451/6 |
| 2014/0154958 A1 * | 6/2014 | Nakamura | ............ B24B 53/017 |
| | | | 451/288 |
| 2015/0104620 A1 | 4/2015 | Takahashi et al. | |
| 2016/0372344 A1 * | 12/2016 | Imai | ......................... F26B 5/12 |

FOREIGN PATENT DOCUMENTS

| | | | |
|---|---|---|---|
| EP | 1696475 A1 | 8/2006 | |
| JP | 2011-177842 A | 9/2011 | |
| JP | 2016-028845 A | 3/2016 | |
| JP | 2017-132034 A | 8/2017 | |
| JP | 2018-161721 A | 10/2018 | |
| JP | 2018176317 A | * 11/2018 | |
| JP | 2019-216207 A | 12/2019 | |
| WO | WO 2005/081301 A1 | 9/2005 | |

OTHER PUBLICATIONS

European Patent Application No. 21179619.8; Extended Search Report; dated Nov. 18, 2021; 9 pages.

* cited by examiner

*Primary Examiner* — Katina N. Henson

(74) *Attorney, Agent, or Firm* — BakerHostetler

(57) ABSTRACT

A substrate processing apparatus which reliably prevents a cleaning liquid containing foreign particles from falling from a polishing head onto a substrate is disclosed. The substrate processing apparatus includes a rotating and holding mechanism, a polishing head, and a head cleaning device configured to supply the cleaning liquid to the polishing head to clean the polishing head during polishing and/or after polishing of the substrate.

16 Claims, 9 Drawing Sheets

SUBSTRATE PROCESSING APPARATUS AND SUBSTRATE PROCESSING METHOD

CROSS REFERENCE TO RELATED APPLICATION

This document claims priority to Japanese Patent Application No. 2020-110491 filed Jun. 26, 2020, the entire contents of which are hereby incorporated by reference.

BACKGROUND

Semiconductor devices are formed on a surface (device surface) of a wafer. When a foreign particle such as polishing debris adheres to the wafer, the wafer is contaminated, and as a result, a yield in semiconductor manufacturing decreases. Therefore, from a viewpoint of improving the yield, it is important to control a surface condition of the wafer against the foreign particle.

There is a method of transporting the wafer by holding only a peripheral portion of the wafer with an arm. In such a method, an unnecessary film remaining on the peripheral portion of the wafer may peel off and adhere to the surface of the wafer during various processes, resulting in a decrease in a yield. Therefore, from the viewpoint of improving the yield, it is important to remove the unnecessary film formed on the peripheral portion of the wafer. Therefore, the substrate processing apparatus may include a bevel polishing apparatus that polishes the peripheral portion of the wafer to remove the unnecessary film.

However, when the peripheral portion of the wafer is polished, the foreign particle such as the polishing debris is generated, and may adhere to a polishing head of the bevel polishing apparatus. If the peripheral portion of the wafer is continuously polished in this state, a liquid for cleaning the water may adhere to the polishing head, and the liquid containing the foreign particle may fall from the polishing head onto the wafer.

SUMMARY OF THE INVENTION

Therefore, there are provided a substrate processing apparatus and a substrate processing method for reliably preventing a liquid containing the foreign particle from falling from the polishing head onto the wafer.

Embodiments, which will be described below, relate to a substrate processing apparatus and a substrate processing method for processing a substrate such as a wafer. In an embodiment, there is provided a substrate processing apparatus comprising: a rotating and holding mechanism configured to hold and rotate a substrate; a polishing head configured to press a polishing tool against a peripheral portion of the substrate to polish the peripheral portion of the substrate; and a head cleaning device configured to supply a cleaning liquid to the polishing head to clean the polishing head during polishing and/or after polishing of the substrate.

In an embodiment, the substrate processing apparatus comprises a tilt mechanism configured to tilt the polishing head, and the head cleaning device supplies the cleaning liquid to the polishing head when the polishing head is arranged below the substrate by the tilt mechanism.

In an embodiment, the substrate processing apparatus comprises a tilt mechanism configured to tilt the polishing head, and the tilt mechanism continuously changes a tilt angle of the polishing head to remove the cleaning liquid after the head cleaning device supplies the cleaning liquid to the polishing head.

In an embodiment, the head cleaning device supplies the cleaning liquid to the polishing head each time one substrate is polished.

In an embodiment, the head cleaning device is arranged above the polishing head, and supplies the cleaning liquid to the polishing head from directly above the polishing head.

In an embodiment, the cleaning liquid is one of pure water, conductive water, and a surfactant solution.

In an embodiment, the substrate processing apparatus comprises a vibration device configured to vibrate the polishing head, and the vibration device vibrates the polishing head to remove the cleaning liquid after the head cleaning device supplies the cleaning liquid to the polishing head.

In an embodiment, the substrate processing apparatus comprises a gas injection device configured to inject a pressurized gas to the polishing head, and the gas injection device injects the pressurized gas to the polishing head to remove the cleaning liquid after the head cleaning device supplies the cleaning liquid to the polishing head.

In an embodiment, the substrate processing apparatus comprises a suction device configured to suck the cleaning liquid adhering to the polishing head, and the suction device sucks the cleaning liquid adhering the polishing head to remove the cleaning liquid after the head cleaning device supplies the cleaning liquid to the polishing head.

In an embodiment, the substrate processing apparatus comprises a circular motion mechanism configured to circularly move the polishing head, and the circular motion mechanism circularly moves the polishing head to remove the cleaning liquid after the head cleaning device supplies the cleaning liquid to the polishing head.

In an embodiment, there is provided a substrate processing method comprising: a substrate rotation process of rotating a substrate while holding the substrate; a polishing process of pressing a polishing tool against a peripheral portion of the substrate to polish the peripheral portion of the substrate; and a head cleaning process of supplying a cleaning liquid to a polishing head to clean the polishing head during polishing and/or after polishing of the substrate.

In an embodiment, the head cleaning process comprises a process of supplying the cleaning to the polishing head when the polishing head is arranged below the substrate.

In an embodiment, the substrate processing method comprises a tilt process of continuously changing a tilt angle of the polishing head to remove the cleaning liquid after supplying the cleaning liquid to the polishing head.

In an embodiment, the head cleaning process is performed each time one substrate is polished.

In an embodiment, the head cleaning process comprises a process of supplying the cleaning liquid to the polishing head from directly above the polishing head.

In an embodiment, the cleaning liquid is one of pure water, conductive water, and a surfactant solution.

In an embodiment, the substrate processing method comprises a vibration process of vibrating the polishing head to remove the cleaning liquid after supplying the cleaning liquid to the polishing head.

In an embodiment, the substrate processing method comprises an injection process of injecting a pressurized gas to the polishing head to remove the cleaning liquid after supplying the cleaning liquid to the polishing head.

In an embodiment, the substrate processing method comprises a suction process of sucking the cleaning liquid adhering to the polishing head to remove the cleaning liquid after supplying the cleaning liquid to the polishing head.

In an embodiment, the substrate processing method comprises a circular motion process of circularly moving the polishing head to remove the cleaning liquid after supplying the cleaning liquid to the polishing head.

The substrate processing apparatus includes the head cleaning device for cleaning the polishing head. Therefore, the head cleaning device can prevent the foreign particle (liquid containing the foreign particle) from adhering to the polishing head, or remove the foreign particle adhered to the polishing head.

DESCRIPTION OF EMBODIMENTS

Embodiments will be described with reference to the drawings.

In this specification, a peripheral portion of a substrate is defined as an area including a bevel portion which is located at an outermost portion of the substrate, a top edge portion and a bottom edge portion which are located radially inward of the bevel portion, and a notch portion which is formed on the peripheral portion of the substrate to identify a crystal orientation.

Figure 1A:
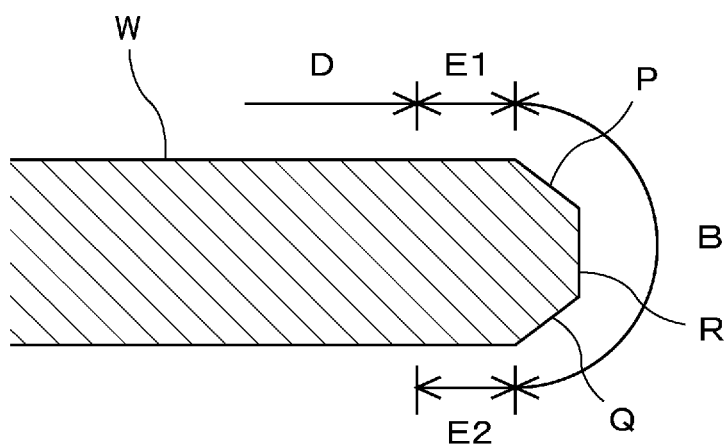
FIG. 1A and FIG. 1B are enlarged cross-sectional views each showing a peripheral portion of a substrate.
Figure 1B:
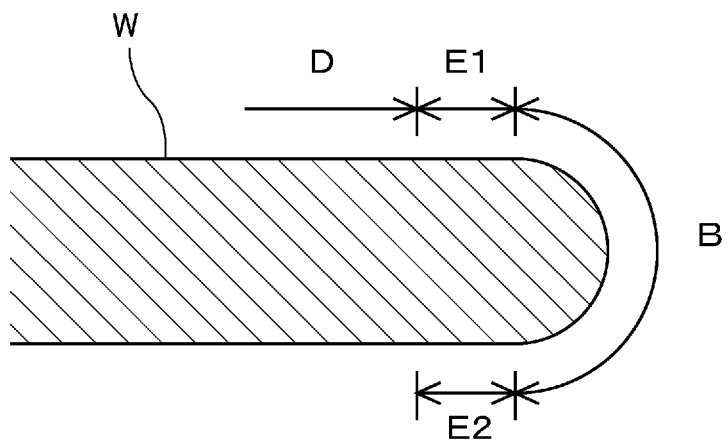

FIG. 1A and FIG. 1B are enlarged cross-sectional views each showing the peripheral portion of the substrate. More specifically, FIG. 1A is a cross-sectional view of a so-called straight-type substrate, and FIG. 1B is a cross-sectional view of a so-called round-type substrate. In a wafer W (an example of a substrate) in FIG. 1A, the bevel portion is an outermost surface of the wafer W (indicated by a symbol B), which is constituted by an upper inclined portion (upper bevel portion) P, a lower inclined portion (lower bevel portion) Q, and a side portion (apex) R. In the wafer W of FIG. 1B, the bevel portion is a portion having a curved cross section (indicated by the symbol B) and constituting the outermost surface of the wafer W. The top edge portion is a flat portion E1, which is located radially inward from the bevel portion B. The bottom edge portion is a flat portion E2, which is located on an opposite side of the top edge portion and is radially inner than the bevel portion B. The top edge portion E1 may include an area where a device is formed.

Figure 2:
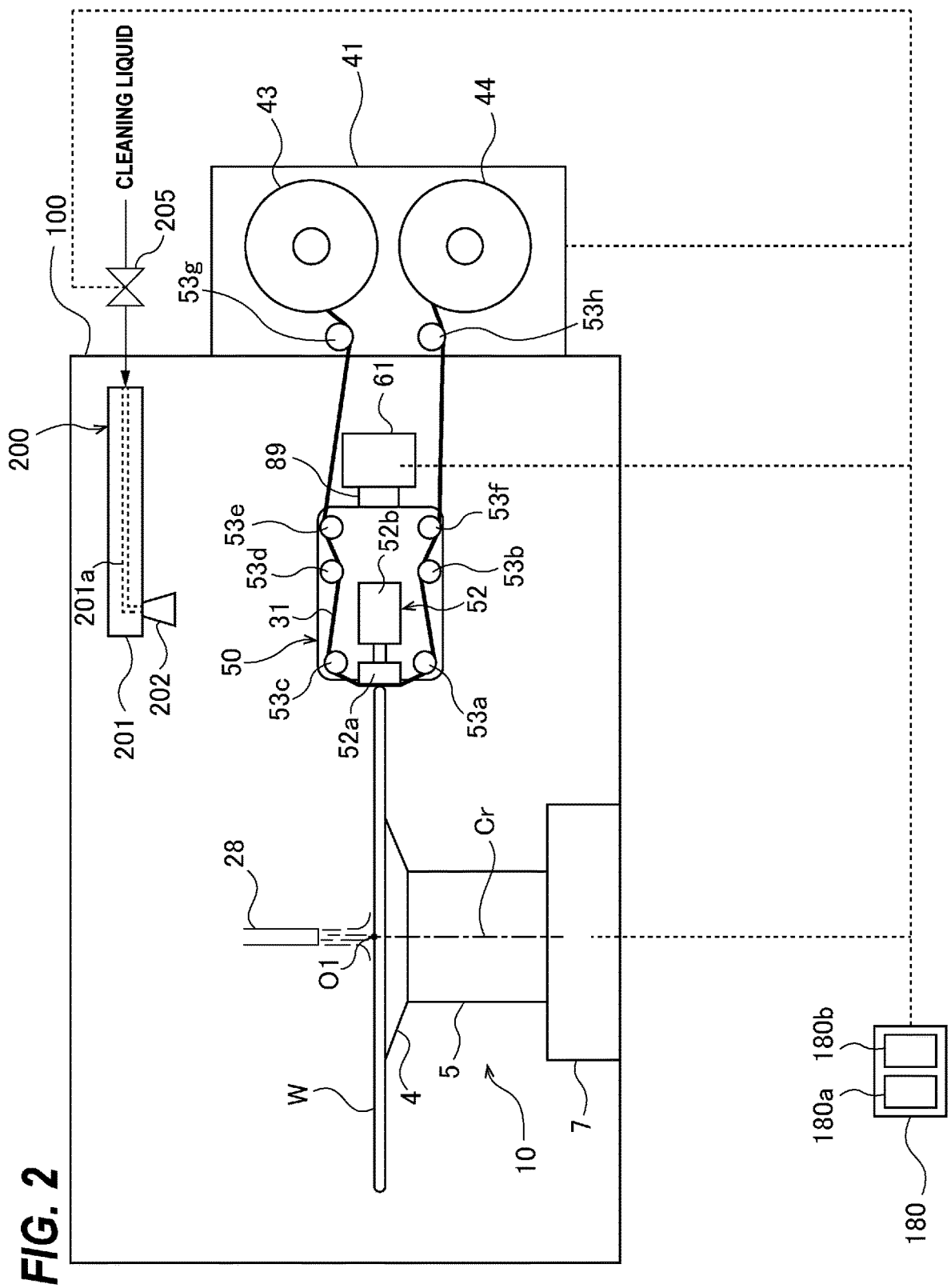
FIG. 2 is a schematic view showing an embodiment of a substrate processing apparatus.

FIG. 2 is a schematic view showing an embodiment of a substrate processing apparatus. The substrate processing apparatus shown in FIG. 2 is suitably used for a bevel polishing apparatus for polishing the bevel portion which is the peripheral portion of the substrate. As shown in FIG. 2, the polishing apparatus includes a rotating and holding mechanism 10 for holding and rotating the wafer W which is an object to be polished, and a polishing head 50 for polishing the bevel portion of the wafer W held in the rotating and holding mechanism 10 to remove a foreign particle and scratches from the bevel portion of the wafer W.

FIG. 2 shows a state in which the rotating and holding mechanism 10 holds the wafer W. The rotating holding mechanism 10 includes a holding stage 4 for holding the wafer W by vacuum suction, a shaft 5 coupled to a center of the holding stage 4, and a holding-stage drive mechanism 7 coupled to a lower end of the shaft 5.

The holding-stage drive mechanism 7 includes a motor and an air cylinder, not shown, to rotate the holding stage 4 and move it up and down. In other words, the holding-stage drive mechanism 7 is configured to rotate the holding stage 4 around its axis center Cr and to move it up and down along the axis center Cr.

The wafer W is placed on a top surface of the holding stage 4 by a transport mechanism (not shown) so that a center O1 of the wafer W is on the axis center Cr of the holding stage 4. The wafer W is held on the top surface of the holding stage 4 with its surface (device surface) facing upward. With this configuration, the rotating and holding mechanism 10 can rotate the wafer W around the axis center Cr of the holding stage 4 (i.e., an axis center of the wafer W), and can also raise and lower the wafer W along the axis center Cr of the holding stage 4.

As shown in FIG. 2, the substrate processing apparatus further includes a partition wall 100 a polishing-tool supply and collection mechanism 41 for supplying a polishing tape 31 to the polishing head 50 and collecting it from the polishing head 50, and a liquid supply nozzle 28 for supplying a liquid onto the surface of the wafer W. The rotating and holding mechanism 10, the polishing head 50, and the liquid supply nozzle 28 are disposed inside the partition wall 100, and the polishing-tool supply and collection mechanism 41 is disposed outside the partition wall 100.

The polishing-tool supply and collection mechanism 41 includes a supply reel 43 for supplying the polishing tape 31 to the polishing head 50 and a collection reel 44 for collecting the polishing tape 31 used for polishing the wafer W. Tension motors (not shown) are coupled to the supply reel 43 and the collection reel 44, respectively. Each tension motor applies a predetermined torque to the supply reel 43 and the collection reel 44 to apply a predetermined tension to the polishing tape 31.

The polishing tape 31 is supplied to the polishing head 50 so that a polishing surface of the polishing tape 31 faces a surface to be polished of the bevel portion of the wafer W. The polishing tape 31 is supplied from the supply reel 43 to the polishing head 50 through an opening (not shown) provided in the partition wall 100, and the used polishing tape 31 is collected by the collection reel 44 through the opening.

The polishing head 50 includes a pressing mechanism 52 for pressing the polishing tape 31 against the bevel portion of the wafer W. The polishing tape 31 is supplied so as to pass through an end surface of the pressing mechanism 52. In this embodiment, the pressing mechanism 52 includes a pressing pad 52a for supporting a back surface of the polishing tape 31, and an air cylinder 52b which is coupled to the pressing pad 52a In one embodiment, the polishing tool may be a grinder instead of the polishing tape 31. In this case, the grinder is held by the air cylinder 52b constituting the pressing mechanism 52, and the polishing-tool supply and collection mechanism 41 and the pressing pad 52a may be omitted.

The pressing mechanism 52 presses the polishing tape 31 from a back side thereof and brings the polishing surface of the polishing tape 31 into contact with the bevel portion of the wafer W to polish the bevel portion of the wafer W. The polishing head 50 further includes a plurality of guide rollers 53a, 53b, 53c, 53d, 53e, and 53f for supporting the polishing tape 31. The polishing-tool supply and collection mechanism 41 further includes a plurality of guide rollers 53g and 53h for supporting the polishing tape 31. A direction of movement of the polishing tape 31 is guided by the guide rollers 53a, 53b, 53c, 53d, 53e, 53f, 53g, and 53h. In particular, the guide rollers 53a and 53c arranged at a tip of the polishing head 50 guide the polishing tape 31 so that the polishing tape 31 moves in a direction parallel to the surface to be polished of the bevel portion of the wafer W.

The liquid supply nozzle 28 is arranged above the wafer W held by the rotating and holding mechanism 10. The liquid supply nozzle 28 is connected to a liquid supply source (not shown). The liquid supply nozzle 28 is arranged so as to face the center O1 of the wafer W, and the liquid is supplied from the liquid supply nozzle 28 to the surface of the wafer W. The liquid supplied to the surface of the wafer W spreads over the entire surface of the wafer W by centrifugal force, and forms a flow of the liquid on the bevel portion of the wafer W. The bevel portion of the wafer W is polished in the presence of a liquid. The liquid flows downward from the peripheral portion of the wafer W to remove the polishing debris from the bevel portion of the wafer W. The above-described liquid prevents the liquid containing the foreign particle such as polishing debris generated by polishing the wafer W from adhering to the surface of the wafer W. As a result, the surface of the wafer W can be kept clean. In this embodiment, pure water or alkaline water is used as the above-described liquid.

As described above, when the peripheral portion of the wafer W is polished, the foreign particle such as polishing debris is generated, and this foreign particle may adhere to the polishing head 50. If the peripheral portion of the wafer W is continuously polished in this state, the liquid supplied from the liquid supply nozzle 28 may adhere to the polishing head 50, and the liquid containing the foreign particle may fall from the polishing head 50 onto the wafer W.

Therefore, in embodiments shown below, a substrate processing apparatus which reliably prevents a cleaning liquid containing the foreign particle from falling onto the wafer W from the polishing head 50 will be described.

As shown in FIG. 2, the substrate processing apparatus includes the polishing head 50 and a head cleaning device 200. The polishing head 50 presses the polishing tape 31, which is an example of the polishing tool, against the peripheral portion of the wafer W to polish the peripheral portion of the wafer W. The head cleaning device 200 supplies the cleaning liquid to the polishing head 50 during polishing and/or after polishing of the wafer W to clean the polishing head 50.

The head cleaning device 200 is arranged above (more specifically, directly above) the polishing head 50 inside the partition wall 100. The head cleaning device 200 may be immovably or movably arranged.

The head cleaning device 200 includes a cleaning arm 201 and a cleaning nozzle 202 arranged so as to face the polishing head 50. The cleaning arm 201 includes a cleaning liquid line 201a through which the cleaning liquid for cleaning the polishing head 50 passes therein. The cleaning nozzle 202 is attached to an end portion of the cleaning arm 201 and is connected to the cleaning liquid line 201a.

The head cleaning device 200 includes an on-off valve 205 for opening and closing the cleaning liquid line 201a. The on-off valve 205 is electrically connected to the operation controller 180. Therefore, the operation controller 180 can control an operation of the on-off valve 205.

The cleaning nozzle 202 is a wide-angle nozzle which injects the cleaning liquid onto the polishing head 50. More specifically, the head cleaning device 200 injects the cleaning liquid in a conical shape through the cleaning nozzle 202 to supply the cleaning liquid to the entire polishing head 50. The cleaning liquid is supplied from directly above the polishing head 50 toward the polishing head 50. In this embodiment, the cleaning liquid is any of pure water, conductive water, and a surfactant solution.

The head cleaning device 200 may supply a cleaning liquid to the polishing head 50 during polishing of the wafer W. With such a configuration, the head cleaning device 200 can prevent the foreign particle from adhering to the polishing head 50. In this embodiment, since the polishing head 50 can be cleaned during polishing of the wafer W, the substrate processing apparatus can clean the polishing head 50 while processing the wafer W without extending the time required for processing the wafer W. In one embodiment, the head cleaning device 200 may supply the cleaning liquid to the polishing head 50 each time one wafer W is polished.

In one embodiment, the head cleaning device 200 may supply the cleaning liquid at the same time when the liquid supply nozzle 28 supplies the liquid onto the wafer W. In another embodiment, the head cleaning device 200 may supply the cleaning liquid at the same time when the polishing head 50 starts the polishing of the peripheral portion of the wafer W.

In one embodiment, the polishing head 50 may have a surface that has been hydrophobized throughout. By performing hydrophobic processing on the entire polishing head 50, it is possible to effectively prevent the adhesion of liquid containing the foreign particle, so that a cleaning effect of the head cleaning device 200 can be further enhanced.

Figure 3:
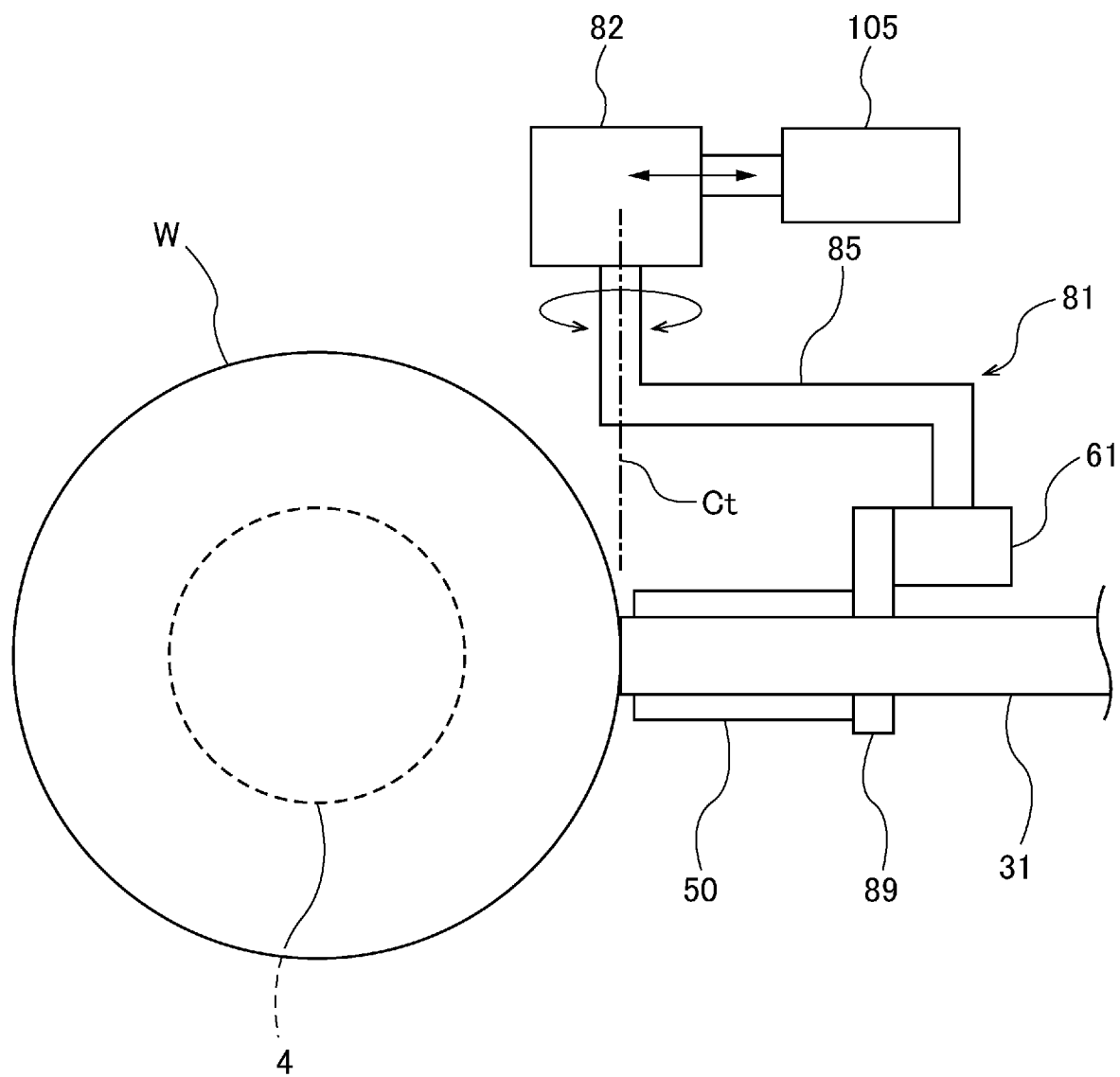
FIG. 3 is a schematic view of the substrate processing apparatus shown in FIG. 2 as viewed from above.

FIG. 3 is a schematic view of the substrate processing apparatus shown in FIG. 2 as viewed from above. In FIG. 3, the head cleaning device 200 is not shown in order to make the drawing easier to see. As shown in FIG. 3, the substrate processing apparatus further includes a tilt mechanism 81 for tilting the polishing head 50 with respect to the surface of the wafer W on the rotating and holding mechanism 10.

The tilt mechanism 81 includes a rotating and driving device 82 and a crank arm 85. The rotating and driving device 82 includes a motor, a pulley, a belt, and the like (not shown). One end of the crank arm 85 is coupled to a circular motion mechanism 61, and the other end is coupled to the rotating and driving device 82. The crank arm 85 is rotated about a rotation axis Ct of the rotating and driving device 82. The rotation axis Ct extends in a tangential direction of the wafer W on the rotating and holding mechanism 10. When the rotating and driving device 82 rotates the crank arm 85 clockwise and counterclockwise by a predetermined angle about the rotation axis Ct, the circular motion mechanism 61 and the polishing head 50 coupled to the crank arm 85 are also rotated clockwise and counterclockwise by a predetermined angle about the rotation axis Ct.

The polishing surface of the polishing tape 31 supported by the polishing head 50 is located on an extension line of the rotation axis Ct of the rotating driving device 82. Therefore, when the rotating and driving device 82 is driven, the polishing head 50 rotates clockwise and counterclockwise by a predetermined angle about the polishing surface of the polishing tape 31.

In this manner, the angle of the polishing head 50 with respect to the bevel portion of the wafer W can be changed by rotating the polishing head 50 around the rotation axis Ct. The rotating and driving device 82 employs a motor such as a servomotor or a stepping motor that can precisely control a position and speed. The polishing head 50 is configured to be rotatable at a desired speed to a programmed desired angle.

Figure 4:
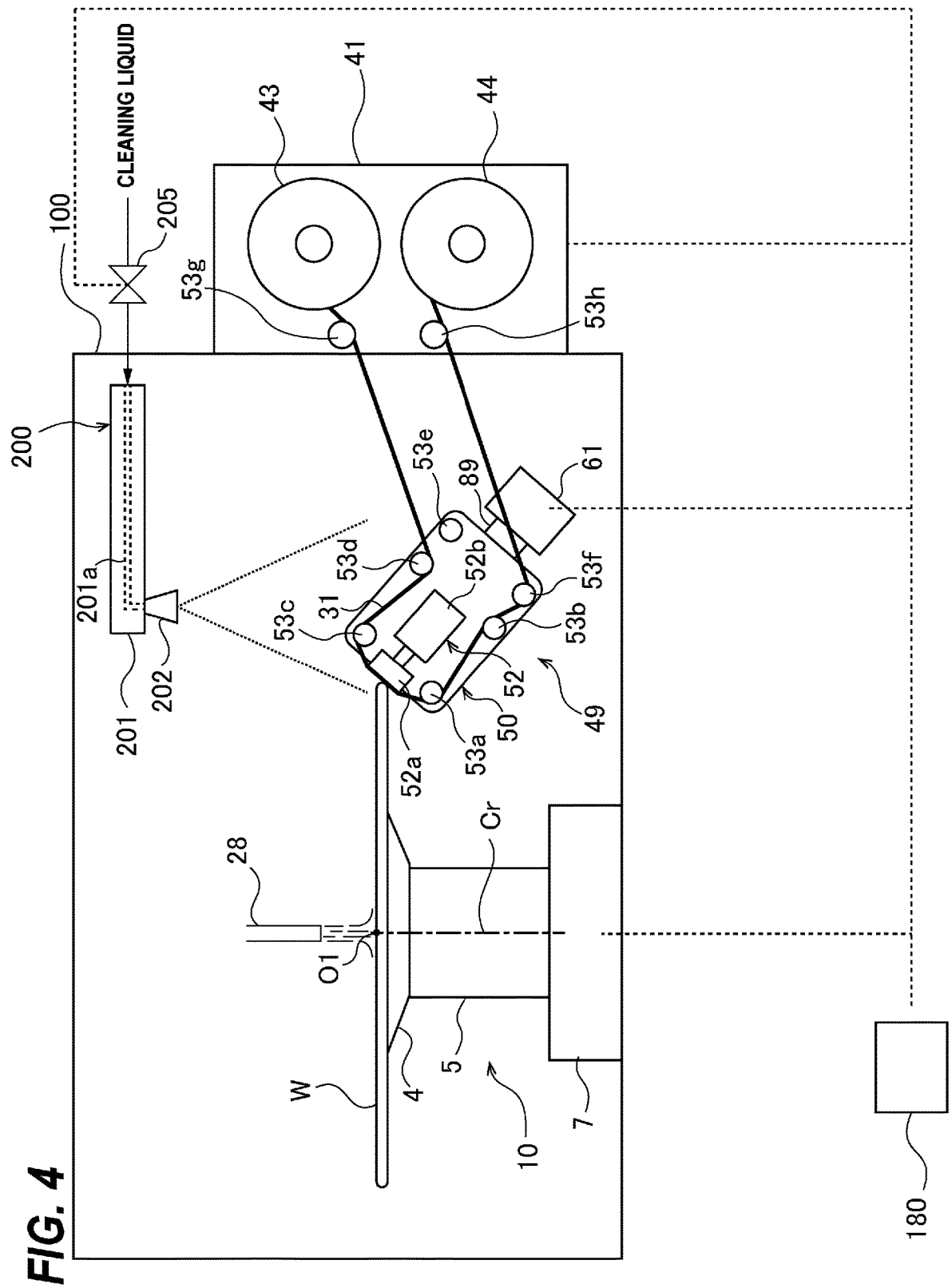
FIG. 4 is a schematic view showing a state in which a polishing head and a circular motion mechanism are tilted downward by a tilt mechanism.
Figure 5:
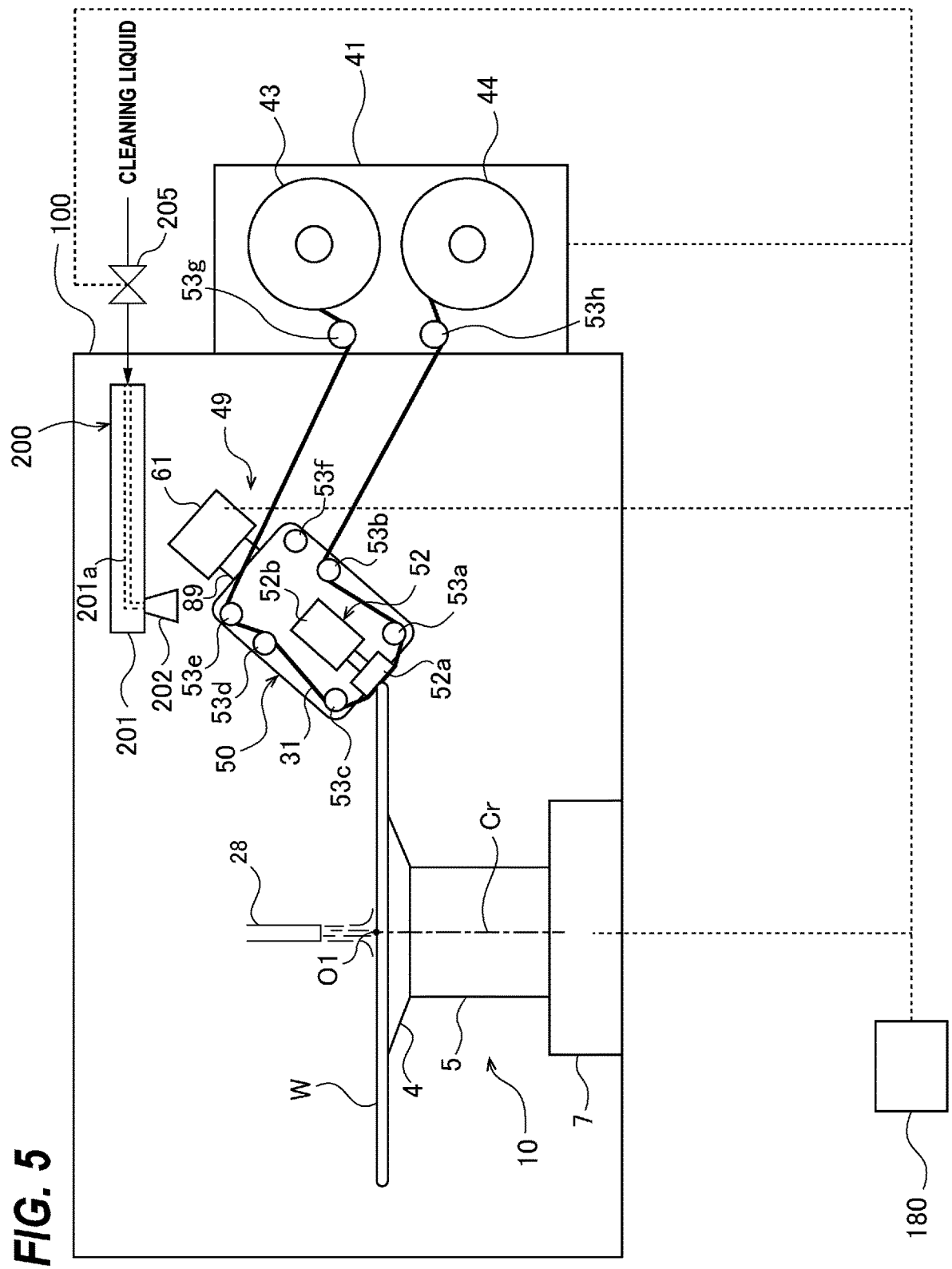
FIG. 5 is a view showing a state in which the polishing head and the circular motion mechanism are tilted upward by the tilt mechanism.

FIG. 4 is a schematic view showing a state in which the polishing head 50 and the circular motion mechanism 61 are tilted downward by the tilt mechanism 81. FIG. 5 is a view showing a state in which the polishing head 50 and the circular motion mechanism 61 are tilted upward by the tilt mechanism 81. In FIG. 4, the polishing tape 31 is in contact with a lower area of the bevel portion of the wafer W, and in FIG. 5, the polishing tape 31 is in contact with an upper area of the bevel portion of the wafer W. In this manner, the entire bevel portion of the wafer W can be polished by changing the angle of the polishing head 50 along the bevel portion of the wafer W.

As shown in FIG. 3, the polishing head 50 is coupled to a polishing-head moving mechanism 105. The polishing-head moving mechanism 105 is fixed to the rotating and driving device 82 of the tilt mechanism 81. The polishing head 50 is coupled to the polishing-head moving mechanism 105 via the tilt mechanism 81 and the circular motion mechanism 61 (described later). The polishing-head moving mechanism 105 is configured to be able to move the polishing head 50 in a radial direction of the wafer W. The polishing-head moving mechanism 105 can be constituted of a linear actuator such as an air cylinder. The polishing-head moving mechanism 105 is electrically connected to the operation controller 180 shown in FIG. 2, and the operation controller 180 controls the operation.

When the wafer W is transported onto the holding stage 4 of the rotating and holding mechanism 10 and when the wafer W is taken out from the holding stage 4 of the rotating and holding mechanism 10, the polishing-head moving mechanism 105 moves the polishing head 50 in a direction away from the holding stage 4. When the bevel portion of the wafer W held by the holding stage 4 is polished, the polishing-head moving mechanism 105 moves the polishing head 50 toward the wafer W.

In this embodiment, the substrate processing apparatus includes one set of the polishing head 50 and the polishing-tool supply and collection mechanism 41. In one embodiment, two sets or more of the polishing head 50 and the polishing-tool supply and collection mechanism 41 may be provided. The number of head cleaning devices 200 corresponds to the number of polishing heads 50.

The head cleaning device 200 may be configured to supply the cleaning liquid to the polishing head 50 by the tilt mechanism 81 when the polishing head 50 is arranged below the wafer W (see FIG. 4). With such a configuration, it is possible to reliably prevent the cleaning liquid that has cleaned the polishing head 50 from adhering to the wafer W.

The head cleaning device 200 may supply the cleaning liquid to the polishing head 50 after the polishing of the wafer W is completed, more specifically, after the wafer W is conveyed from the rotating and holding mechanism 10. With such a configuration, it is possible to more reliably prevent the cleaning liquid that has cleaned the polishing head 50 from adhering to the wafer W.

The tilt mechanism 81 may remove the cleaning liquid by continuously changing a tilt angle of the polishing head 50 after the head cleaning device 200 supplies the cleaning liquid to the polishing head 50. More specifically, as shown in FIGS. 4 and 5, the tilt mechanism 81 changes vertically the angle of the polishing head 50 around the peripheral portion of the wafer W, so that the tilt mechanism 81 can shake off the liquid (e.g., the cleaning liquid) adhering to the polishing head 50.

The polishing head 50 further includes the circular motion mechanism 61 that causes a polishing-tool support structure to make a circular motion relative to the wafer W. In this specification, the polishing-tool support structure is defined as a structure that supports the polishing tool, and constitutes at least a part of the polishing head 50. In this embodiment, the polishing-tool support structure is the entire polishing head 50. The polishing head 50 faces the peripheral portion of the wafer W when the wafer W is held by the rotating and holding mechanism 10.

Figure 6:
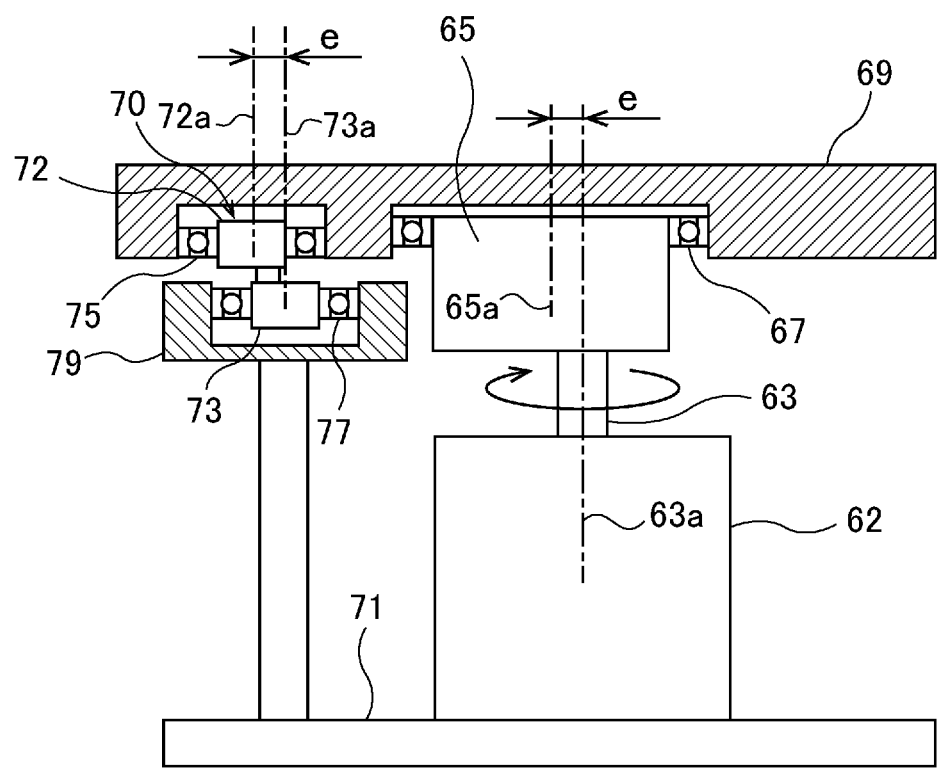
FIG. 6 is a schematic view showing an embodiment of the circular motion mechanism for circularly moving a polishing-tool support structure.

FIG. 6 is a schematic view showing an embodiment of the circular motion mechanism 61 for circularly moving the polishing-tool support structure. The circular motion mechanism 61 shown in FIG. 6 includes a motor 62, an eccentric rotating body 65 fixed to a rotating shaft 63 of the motor 62, a table 69 coupled to the eccentric rotating body 65 via a bearing 67, and a plurality of cranks 70 for supporting the table 69. Although only one crank 70 is shown in FIG. 6, at least three cranks 70 are arranged around the eccentric rotating body 65. The motor 62 is fixed to a base 71.

An axis 65a of the eccentric rotating body 65 is separated from an axis 63a of the rotating shaft 63 of the motor 62 by a distance e. Therefore, when the motor 62 is operated, the eccentric rotating body 65 makes a circular motion with a radius e. The crank 70 has a first shaft body 72 and a second shaft body 73 fixed to each other. An axis 72a of the first axis 72 and an axis 73a of the second axis 73 are also separated by a distance e. The first shaft body 72 is rotatably supported by the bearing 75 held by the table 69. The second shaft body 73 is rotatably supported by the bearing 77. The bearing 77 is fixed to a support member 79 fixed to the base 71.

According to the above configuration, when the motor 62 rotates, the eccentric rotating body 65 makes a circular motion with the radius e, and the table 69 coupled to the eccentric rotating body 65 via the bearing 67 also makes a circular motion with the radius e. In this specification, the circular motion is defined as the motion of an object moving in a circular orbit.

The table 69 is supported by a plurality of cranks 70. Therefore, the table 69 itself does not rotate when the table 69 is in the circular motion. Such a motion of the table 69 is also called a translational rotational motion. In this specification, the motion of the object moving in a circular orbit without rotating the object itself is defined as a translational rotational motion. This translational rotational motion is a specific example of circular motion. In this embodiment, the polishing head 50 is fixed to the table 69 via the holding member 89. Therefore, the polishing head 50 performs a circular motion (translational rotational motion) together with the table 69. In this embodiment, the circular motion mechanism 61 is a translational rotation mechanism that causes the polishing-tool support structure (the entire polishing head 50) to perform a translational rotational movement. The circular motion (translational rotational motion) of this embodiment is a circular motion (translational rotational motion) in a plane having the direction of the polishing head 50 as the normal direction.

The circular motion mechanism 61 may remove the cleaning liquid by circularly moving the polishing head 50 after the head cleaning device 200 supplies the cleaning liquid to the polishing head 50. With such a configuration, the circular motion mechanism 61 can shake off the liquid (e.g., the cleaning liquid) adhering to the polishing head 50.

Figure 7:
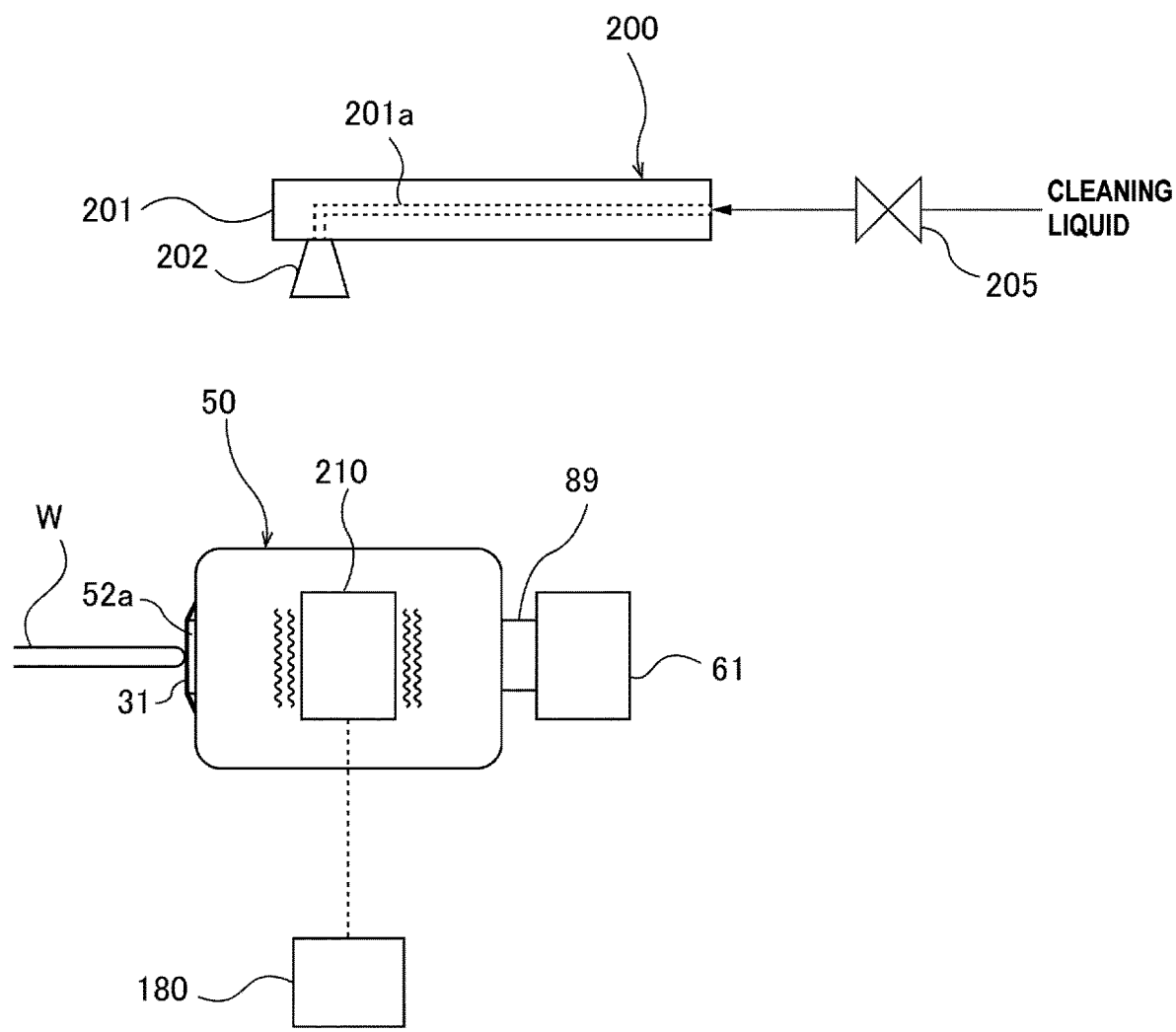
FIG. 7 is a view showing a vibration device for vibrating the polishing head.

FIG. 7 is a view showing a vibration device for vibrating the polishing head 50. As shown in FIG. 7, the substrate processing apparatus includes a vibration device 210 for vibrating the polishing head 50. The vibration device 210 is attached to the polishing head 50 and is electrically connected to the operation controller 180. The vibration device 210 vibrates according to a command of the operation controller 180, and the polishing head 50 vibrates together with the vibration device 210. The vibration device 210 vibrates the polishing head 50 to remove the cleaning liquid after the head cleaning device 200 supplies the cleaning liquid to the polishing head 50.

Figure 8:
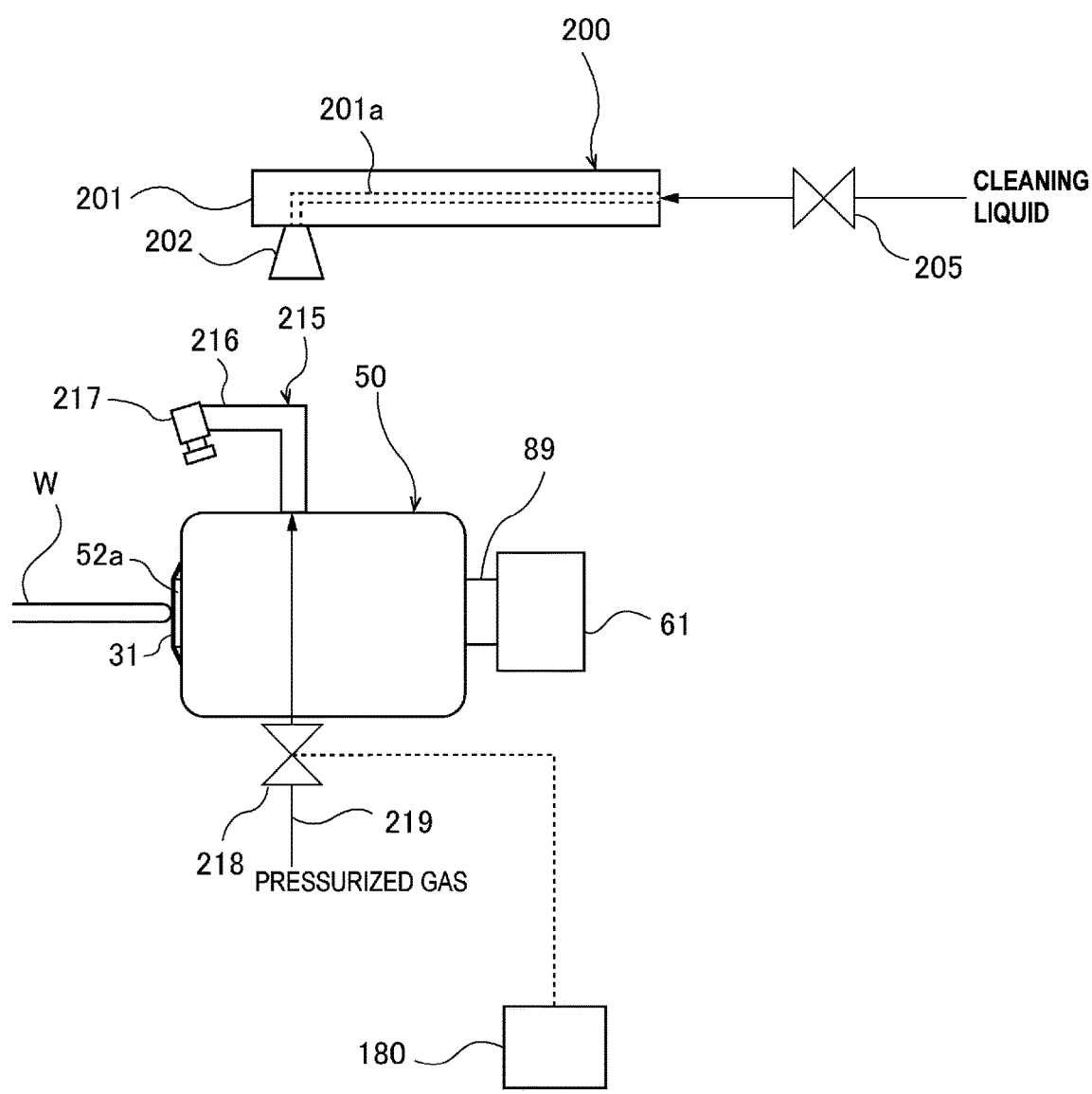
FIG. 8 is a view showing a gas injection device for injecting a pressurized gas onto the polishing head.

FIG. 8 is a view showing a gas injection device for injecting a pressurized gas onto the polishing head 50. As shown in FIG. 8, the substrate processing apparatus includes a gas injection device 215 for injecting a pressurized gas onto the polishing head 50. The gas injection device 215 includes an injection arm 216 attached to the polishing head 50 and an injection nozzle 217 arranged so as to face the polishing head 50. The injection nozzle 217 is attached to an end of the injection arm 216, and a gas flow path 219 connected to the injection nozzle 217 can be opened and closed by an on-off valve 218.

The operation controller 180 is electrically connected to the on-off valve 218 and can open and close the on-off valve 218. When the operation controller 180 opens the on-off valve 217, the pressurized gas is injected onto the polishing head 50 through the injection nozzle 217. The gas injection device 215 injects the pressurized gas to the polishing head 50 after the head cleaning device 200 supplies the cleaning liquid onto the polishing head 50 to remove the cleaning liquid.

Figure 9:
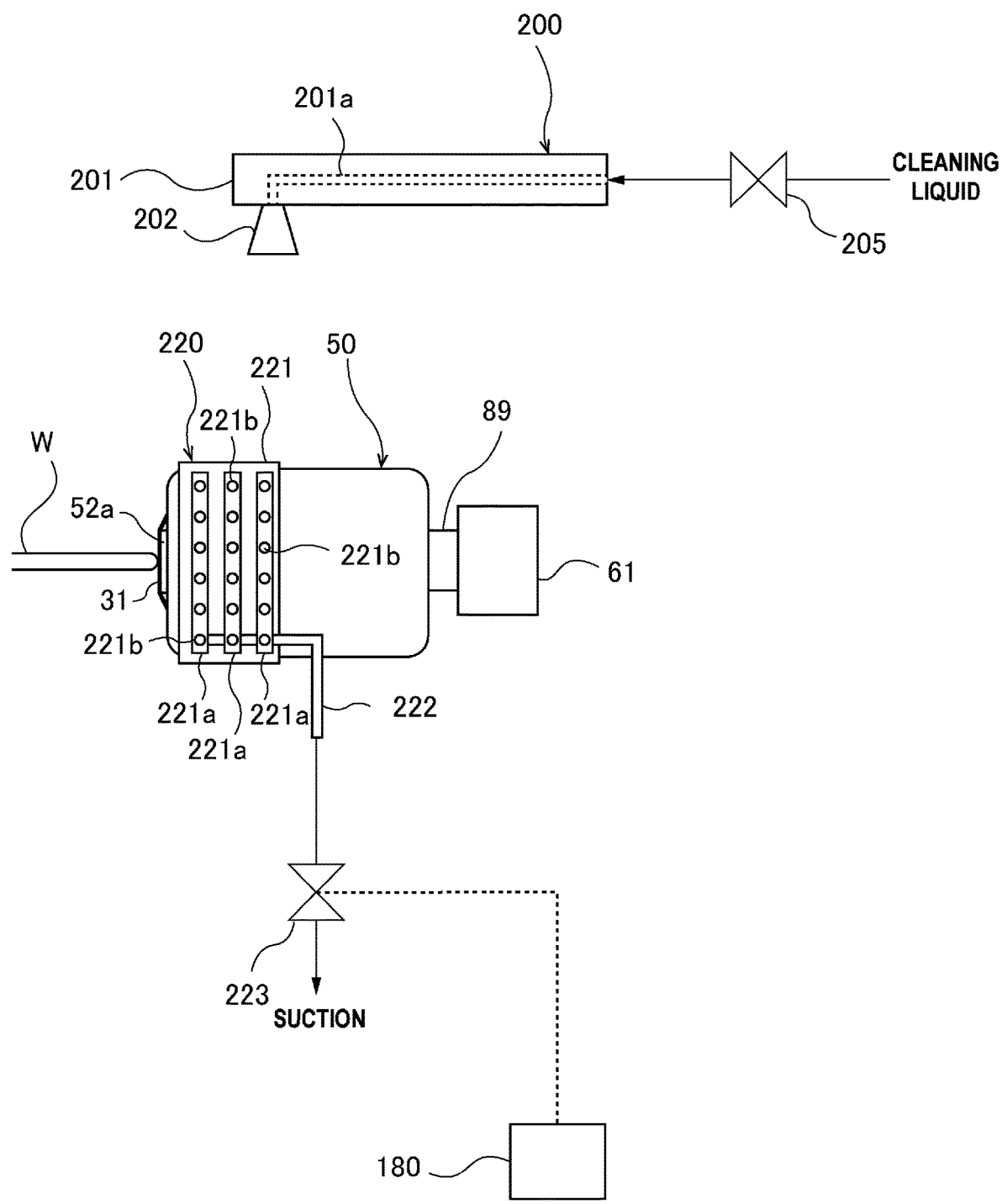
FIG. 9 is a view showing a suction device for sucking a cleaning liquid adhering to the polishing head.

FIG. 9 is a view showing a suction device for sucking the cleaning liquid adhering to the polishing head 50. As shown in FIG. 9, the substrate processing apparatus includes a suction device 220 for sucking the cleaning liquid adhering to the polishing head 50. The polishing head 50 includes a head cover 221 attached to the surface thereof. The suction device 220 includes a suction line 222 connected to the head cover 221 of the polishing head 50 and an on-off valve 223 attached to the suction line 222. The on-off valve 223 opens and closes the suction line 222.

A plurality of grooves 221a are formed on a surface of the head cover 221. A plurality of suction holes 221b are formed in each of the grooves 221a. The suction line 222 is connected to each of suction holes 221b.

The operation controller 180 is electrically connected to the on-off valve 223 and can open and close the on-off valve 223. When the operation controller 180 opens the on-off valve 223, the liquid adhering to the polishing head 50 (more specifically, the head cover 221) is sucked into the suction hole 221b and removed from the polishing head 50. The suction device 220 sucks the cleaning liquid adhering to the polishing head 50 to remove the cleaning liquid after the head cleaning device 200 supplies the cleaning liquid to the polishing head 50.

Operations of the substrate processing apparatus will be described. The operations of the substrate processing apparatus described below are controlled by the operation controller 180 shown in FIG. 2. The operation controller 180 is constituted by a dedicated computer or a general-purpose computer. The operation controller 180 includes a storage device 180a that stores the program and a processing device 180b that executes operations according to the program.

The operation controller 180 constituted by the computer operates according to a program electrically stored in the storage device 180a. The program causes the processing device 180b to execute an operation of causing the rotating and holding mechanism 10 to execute a substrate rotation process of rotating the wafer W while holding the wafer W. The program causes the processing device 180b to execute an operation of causing the polishing head 50 to execute a polishing process of pressing the polishing tool (polishing tape 31 in this embodiment) against the peripheral portion of the wafer W to polish the peripheral portion of the wafer W. The program causes the processing device 180b to execute an operation of causing the head cleaning device 200 to execute a head cleaning process for supplying the cleaning liquid onto the polishing head 50 to clean the polishing head 50 during polishing and/or after polishing of the wafer W.

In other words, the operation controller 180 executes a step of causing the rotating and holding mechanism 10 to execute the substrate rotation process, a step of causing the polishing head 50 to execute the polishing process, and a step of causing the head cleaning device 200 to execute the head cleaning process.

The program for causing the operation controller 180 to execute the above-described steps is stored in a non-transitory tangible computer-readable storage medium. The operation controller 180 is provided with the program via the storage medium. The program may be input to the operation controller 180 from a communication device (not shown) via communication network such as the Internet or a local area network. The storage device 180a includes a main storage device such as a RAM and an auxiliary storage device such as a hard disk drive (HDD) and a solid state drive (SSD). Examples of the processing device 180b include a CPU (central processing unit) and a GPU (graphic processing unit).

The wafer W to be polished is held by the holding stage 4 so that the surface (device surface) is facing upward and the center O1 of the wafer W is located on the axial center Cr of the holding stage 4 by a transfer mechanism (not shown). Then, the wafer W is rotated around the axis Cr (i.e., the axis of the wafer W) of the holding stage 4. Next, the liquid is supplied from the liquid supply nozzle 28 onto the surface of the wafer W. The liquid supplied onto the surface of the wafer W spreads over the entire surface of the wafer W by centrifugal force, and forms a flow of the liquid on the bevel portion of the wafer W.

The polishing tape 31 is supplied to the polishing head 50 in advance. The operation controller 180 drives the polishing-tool supply and collection mechanism 41 and advances the polishing tape 31 in a direction parallel to the end surface of the pressing mechanism 52 while applying a predetermined tension.

The bevel portion of the wafer W is polished while supplying the liquid onto the surface of the wafer W and bringing the polishing tape 31 into contact with the bevel portion of the rotating wafer W. The head cleaning device 200 may supply the cleaning liquid to the polishing head 50 during polishing of the wafer W.

In a case of polishing the peripheral portion of the wafer W while changing the angle of the polishing head 50 with respect to the wafer W by the tilt mechanism 81. When the polishing head 50 is arranged below the wafer W, the operation controller 180 may open the on-off valve 205 to supply the cleaning liquid to the polishing head 50. When the polishing head 50 is arranged above the wafer W, the operation controller 180 may close the on-off valve 205.

After the elapse of a preset time, the operation controller 180 stops the operations of the rotating and holding mechanism 10, the polishing head 50, and the polishing-tool supply and collection mechanism 41 to finish the polishing. The head cleaning device 200 may supply the cleaning liquid onto the polishing head 50 after polishing the wafer W. After supplying the cleaning liquid onto the polishing head 50, the operation controller 180 may continuously change the tilt angle of the polishing head 50 to cause the tilt mechanism 81 to execute a tilt process of removing the cleaning liquid.

The operation controller 180 may cause the vibration device 210 to execute a vibration process of vibrating the polishing head 50 to remove the cleaning liquid after supplying the cleaning liquid onto the polishing head 50. The operation controller 180 may cause the gas injection device 215 to execute an injection process of injecting the pressurized gas to the polishing head 50 to remove the cleaning liquid after supplying the cleaning liquid onto the polishing head 50. The operation controller 180 may cause the suction device 220 to execute a suction process of sucking the cleaning liquid adhered to the polishing head 50 to remove the cleaning liquid after supplying the cleaning liquid onto the polishing head 50. The operation controller 180 may cause the circular motion mechanism 61 to execute a circular motion process of circularly moving the polishing head 50 to remove the cleaning liquid after supplying the cleaning liquid onto the polishing head 50.

The embodiments described above may be combined as appropriate. In particular, in the above-described embodiment, a plurality of processes for removing the cleaning liquid adhering to the polishing head 50 have been described. These processes may be combined as much as possible.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus comprising:
a rotating and holding mechanism configured to hold and rotate a substrate;
a polishing head configured to press a polishing tool against a peripheral portion of the substrate to polish the peripheral portion of the substrate;
a head cleaning device configured to supply a cleaning liquid to the polishing head to clean the polishing head after polishing of the substrate, the head cleaning device being arranged above the polishing head, and supplies the cleaning liquid to the polishing head from directly above the polishing head,
wherein the head cleaning device comprises a cleaning nozzle arranged so as to face the polishing head, and the cleaning nozzle is arranged vertically downward above the polishing head; and
an operation controller configured to at least cause:
rotation of the rotating and holding mechanism;
pressing the polishing tools against a peripheral portion of the substrate while the rotation and holding mechanism rotates a held substrate;
cause a motor to tilt the polishing head below the substrate after stopping the rotation and pressing; and
supplying cleaning liquid from the head cleaning device to the polishing head when the polishing head is tilted below the substrate,
a suction device to suck the cleaning liquid adhering to the polishing head, wherein the suction device sucks the cleaning liquid adhering the polishing head to remove the cleaning liquid after the head cleaning device supplies the cleaning liquid to the polishing head,
and wherein the polishing head comprises a head cover attached to the surface, wherein the suction device comprises a suction line connected to the head cover, the suction line comprising an on-off valve wherein the on-off valve opens and closes the suction line,
wherein a plurality of grooves are formed on a surface of the head cover, wherein a plurality of suction holes are formed in each of the plurality of grooves, and wherein the suction line is coupled to each of suction holes.

2. The substrate processing apparatus according to claim 1,
wherein the operation controller is further configured to continuously changes a tilt angle of the polishing head to remove the cleaning liquid after the head cleaning device supplies the cleaning liquid to the polishing head.

3. The substrate processing apparatus according to claim 1, wherein the head cleaning device is configured to supply the cleaning liquid to the polishing head each time one substrate is polished.

4. The substrate processing apparatus according to claim 1, wherein the cleaning liquid is one of pure water, conductive water, and a surfactant solution.

5. The substrate processing apparatus according to claim 1, wherein the substrate processing apparatus comprises a controller configured to cause a vibration device to vibrate the polishing head, wherein the vibration device vibrates the polishing head to remove the cleaning liquid after the head cleaning device supplies the cleaning liquid to the polishing head.

6. The substrate processing apparatus according to claim 1, wherein the substrate processing apparatus comprises a gas injection device configured to inject a pressurized gas to the polishing head, and
wherein the gas injection device injects the pressurized gas to the polishing head to remove the cleaning liquid after the head cleaning device supplies the cleaning liquid to the polishing head.

7. The substrate processing apparatus according to claim 6, wherein the gas injection device comprises an injection arm attached to the polishing head and an injection nozzle arranged so as to face the polishing head, the injection nozzle being attached to an end of the injection arm.

8. The substrate processing apparatus according to claim 1, wherein the substrate processing apparatus comprises a circular motion mechanism configured to circularly move the polishing head, and
wherein the circular motion mechanism circularly moves the polishing head to remove the cleaning liquid after the head cleaning device supplies the cleaning liquid to the polishing head.

9. A substrate processing method comprising:
rotating a substrate while holding the substrate;
pressing a polishing tool against a peripheral portion of the substrate to polish the peripheral portion of the substrate; stopping the rotating of the substrate and tilting the polishing head below the substrate;

supplying a cleaning liquid to a polishing head to clean the polishing head during polishing and/or after polishing of the substrate, wherein the supplying a cleaning liquid comprising supplying the cleaning liquid to the polishing head from a cleaning nozzle arranged directly above and vertically downward from the polishing head, and supplying the cleaning liquid to the polishing head when the polishing head is arranged below the substrate after polishing of the substrate, sucking the cleaning liquid adhering to the polishing head, wherein a suction device sucks the cleaning liquid adhering the polishing head to remove the cleaning liquid after a head cleaning device supplies the cleaning liquid to the polishing head, and wherein the polishing head comprises a head cover attached to the surface, wherein the suction device comprises a suction line connected to the head cover, the suction line comprising an on-off valve wherein the on-off valve opens and closes the suction line, wherein a plurality of grooves are formed on a surface of the head cover, wherein a plurality of suction holes are formed in each of the plurality of grooves, and wherein the suction line is coupled to each of suction holes.

10. The substrate processing method according to claim 9, comprising continuously changing a tilt angle of the polishing head to remove the cleaning liquid after supplying the cleaning liquid to the polishing head.

11. The substrate processing method according to claim 9, wherein the supplying a cleaning liquid is performed each time one substrate is polished.

12. The substrate processing method according to claim 9, wherein the cleaning liquid is one of pure water, conductive water, and a surfactant solution.

13. The substrate processing method according to claim 9, comprising vibrating the polishing head to remove the cleaning liquid after supplying the cleaning liquid to the polishing head.

14. The substrate processing method according to claim 9, comprising injecting a pressurized gas to the polishing head to remove the cleaning liquid after supplying the cleaning liquid to the polishing head.

15. The substrate processing method according to claim 9, comprising sucking the cleaning liquid adhering to the polishing head to remove the cleaning liquid after supplying the cleaning liquid to the polishing head.

16. The substrate processing method according to claim 9, comprising circularly moving the polishing head to remove the cleaning liquid after supplying the cleaning liquid to the polishing head.

* * * * *